US007547460B2

(12) United States Patent  (10) Patent No.: US 7,547,460 B2
Cucchetti et al.  (45) Date of Patent: Jun. 16, 2009

(54) ION IMPLANTER OPTIMIZER SCAN WAVEFORM RETENTION AND RECOVERY

(75) Inventors: Antonella Cucchetti, Boston, MA (US); Joseph Olson, Beverly, MA (US); Gregory Gibilaro, Topsfield, MA (US); Rosario Mollica, Wilmington, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/950,939

(22) Filed: Sep. 12, 2001

(65) Prior Publication Data

US 2002/0081788 A1 Jun. 27, 2002

Related U.S. Application Data

(60) Provisional application No. 60/232,704, filed on Sep. 15, 2000.

(51) Int. Cl.
C23C 14/54 (2006.01)
C23C 14/48 (2006.01)

(52) U.S. Cl. .................. 427/8; 427/523; 250/396 R; 250/397; 250/492.21; 250/492.3

(58) Field of Classification Search .............. 427/523, 427/8, 525–531, 533; 250/396 R, 397, 492.21, 250/492.3
See application file for complete search history.

(56) References Cited

U.S. PATENT DOCUMENTS

| | | | |
|---|---|---|---|
| 3,689,766 A | 9/1972 | Freeman | |
| 3,778,626 A | 12/1973 | Robertson | |
| 4,021,675 A | 5/1977 | Shifrin | |
| 4,421,988 A | 12/1983 | Robertson et al. | ........ 250/492.2 |
| 4,494,005 A | 1/1985 | Shibata et al. | |
| 4,736,107 A | 4/1988 | Myron | |

(Continued)

FOREIGN PATENT DOCUMENTS

EP 0 398 269 11/1990

(Continued)

OTHER PUBLICATIONS

Translation of JP 4-163,847, Jun. 9, 1992.*

(Continued)

*Primary Examiner*—Marianne L Padgett

(57) ABSTRACT

Methods and apparatus are provided for controlling dose uniformity in an ion implantation system. According to one embodiment of the invention, an initial scan waveform is adjusted to obtain a desired uniformity for use in a first implant process, and the adjusted scan waveform is stored. The stored scan waveform is recalled and used in a second implant process. According to a another embodiment of the invention, desired beam parameters are identified and, based on the desired beam parameters, a stored scan waveform is recalled for use in a uniformity adjustment process, and the uniformity adjustment process is performed. According to a further embodiment of the invention, an apparatus is provided that includes a beam profiler for measuring a current distribution of a scanned ion beam. The apparatus also includes a data acquisition and analysis unit for adjusting an initial scan waveform based on a desired current distribution and the measured current distribution for use in a first implant process, storing the adjusted scan waveform, recalling the stored scan waveform, and using the recalled scan waveform in a second implant process.

16 Claims, 4 Drawing Sheets

U.S. PATENT DOCUMENTS

| | | | |
|---|---|---|---|
| 4,816,693 A * | 3/1989 | Rathmell | 250/492.21 |
| 4,849,641 A * | 7/1989 | Berkowitz | 250/492.2 |
| 4,922,106 A | 5/1990 | Berrian et al. | 250/492.2 |
| 4,980,562 A * | 12/1990 | Berrian et al. | 250/492.2 |
| 5,432,352 A | 7/1995 | van Bavel | |
| 5,483,077 A * | 1/1996 | Glavish | 250/492.2 |
| 5,760,409 A * | 6/1998 | Chen et al. | 250/492.21 |
| 5,825,670 A * | 10/1998 | Chernoff et al. | 702/85 |
| 5,981,961 A | 11/1999 | Edwards et al. | 250/492.21 |
| 6,005,253 A | 12/1999 | Kong | |
| 6,031,240 A * | 2/2000 | Kodama | 250/492.21 |
| 6,075,249 A * | 6/2000 | Olson | 250/369 R |
| 6,297,510 B1 * | 10/2001 | Farley | 250/492.21 |
| 6,580,083 B2 * | 6/2003 | Berrian | 250/492.21 |
| 6,661,016 B2 * | 12/2003 | Berrian | 250/492.21 |
| 6,677,599 B2 * | 1/2004 | Berrian | 250/492.3 |
| 6,696,688 B2 * | 2/2004 | White et al. | 250/396 ML |
| 6,710,359 B2 * | 3/2004 | Olson et al. | 250/492.21 |
| 6,777,695 B2 * | 8/2004 | Viviani | 250/492.21 |
| 6,791,097 B2 * | 9/2004 | Scheuer et al. | 250/492.21 |
| 6,797,967 B1 * | 9/2004 | Tse et al. | 250/492.21 |
| 6,822,247 B2 * | 11/2004 | Sasaki | 250/492.21 |
| 6,870,170 B1 * | 3/2005 | Farley et al. | 250/492.21 |
| 7,105,839 B2 * | 9/2006 | White | 250/492.21 |
| 7,189,980 B2 * | 3/2007 | Mollica | 250/492.21 |
| 7,235,797 B2 * | 6/2007 | Murrell et al. | 250/492.21 |
| 7,253,423 B2 * | 8/2007 | Chang et al. | 250/492.21 |
| 7,253,424 B2 * | 8/2007 | Murrell et al. | 250/492.21 |
| 7,323,700 B1 * | 1/2008 | Ledoux et al. | 250/492.21 |
| 2005/0121626 A1 * | 6/2005 | Sheng et al. | 250/492.21 |
| 2006/0076510 A1 * | 4/2006 | Chang et al. | 250/492.21 |
| 2006/0097196 A1 * | 5/2006 | Graf et al. | 250/492.21 |
| 2006/0266957 A1 * | 11/2006 | Chang et al. | 250/492.21 |
| 2007/0085037 A1 * | 4/2007 | Chang et al. | 250/492.21 |
| 2007/0105355 A1 * | 5/2007 | Murrell et al. | 438/535 |

FOREIGN PATENT DOCUMENTS

| | | | |
|---|---|---|---|
| EP | 0 542 560 | | 5/1993 |
| JP | 4-163847 | * | 6/1992 |
| JP | 6-103956 | * | 4/1994 |
| JP | 6-325723 | * | 11/1994 |

OTHER PUBLICATIONS

Translation of JP 6-325,723, Nov. 25, 1994.*
Translation of JP 6-103,956, Apr. 15, 1994.*
Patent Abstract of Japan, 06325723, Nov. 25, 1994.
Patent Abstract of Japan, 06103956, May 15, 1994.
Patent Abstract of Japan, 04163847, Jun. 9, 1992.

* cited by examiner

ION IMPLANTER OPTIMIZER SCAN WAVEFORM RETENTION AND RECOVERY

CROSS-REFERENCE TO RELATED APPLICATION

This application claims the benefit of provisional application Ser. No. 60/232,704 filed Sep. 15, 2000, which is hereby incorporated by reference.

FIELD OF THE INVENTION

This invention relates to systems and methods for ion implantation of semiconductor wafers or other workpieces and, more particularly, to methods and apparatus for optimizing the uniformity of a scanned ion beam.

BACKGROUND OF THE INVENTION

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement. An ion implanter which utilizes a combination of beam scanning and target movement is disclosed in U.S. Pat. No. 4,922,106 issued May 1, 1990 to Berrian et al.

In the beam scanning approach, an ion beam is deflected by a scanning system to produce ion trajectories which diverge from a point, referred to as the scan origin. The scanned beam then is passed through an ion optical element which performs focusing. The ion optical element converts the diverging ion trajectories to parallel ion trajectories for delivery to the semiconductor wafer. Focusing can be performed with an angle corrector magnet or with an electrostatic lens.

The scanning system typically comprises scan plates to deflect the ion beam, and a scan generator for applying scan voltages to the scan plates. The voltages on the scan plates produce an electric field in the region between the scan plates that deflects ions in the ion beam. A scan voltage waveform is typically a sawtooth, or triangular, waveform, which, in combination with wafer movement, produces scanning of the ion beam over the wafer surface.

Uniform implantation of ions across the surface of the semiconductor wafer is an important requirement in many applications. In theory, a scan waveform with a constant ramp rate of voltage or beam position should produce a beam current that is uniform, i.e., constant at all positions. In practice, this never happens because of aberrations in the beam optics, slight changes in the beam shape as the beam is deflected, nonlinearity in the relationship between voltage and beam position, etc. To achieve a desired uniformity over the wafer surface, a uniformity optimization process has been employed in prior art ion implantation systems. A linear scan waveform is initially applied to the scan plates, so that the scan plates sweep the ion beam in one dimension at a constant rate. The uniformity of the scanned ion beam is measured, and the scan waveform is adjusted to cause a change in the ion beam distribution across the semiconductor wafer. The rate at which the scan plates sweep the ion beam across the wafer surface determines a dosage of the ion implantation. The scan waveform is typically piecewise linear. Initially, all segments of the piecewise linear waveform have slopes of equal magnitude. Adjustment of the scan waveform involves adjusting values which define the slopes of each of the piecewise linear segments of the scan waveform. In general, the initial linear scan waveform may not produce a desired uniformity across the semiconductor wafer, and a nonlinear scan waveform may be required. The measurement of beam uniformity and adjustment of the scan waveform are repeated until the desired uniformity is achieved.

A typical user of the ion implantation system may need to set up multiple implants of different ion species at different energies and doses. The setup process is typically repeated for each set of implant parameters. The setup process is typically time consuming and reduces the throughput of the ion implanters.

In some cases, the setup process for ion implanters is automated. The automated process may permit a predetermined number of iterations of the uniformity optimization process wherein the beam uniformity is measured, the scan waveform is adjusted and the beam uniformity is again measured. If the desired uniformity is not achieved in the predetermined number of iterations, the optimization process is terminated. Accordingly, a parameter known as success rate is associated with the automated uniformity optimization process. The process is considered a success if the desired uniformity is achieved within the predetermined number of iterations. In practice, even the automated optimization process can be time consuming and detract from ion implanter throughput.

Accordingly, there is a need for improved methods and apparatus for optimizing the uniformity of a scanned ion beam.

SUMMARY OF THE INVENTION

According to a first aspect of the invention, a method is provided for controlling dose uniformity in an ion implantation system. The method comprises the acts of adjusting an initial scan waveform to obtain a desired uniformity for use in a first implant process, storing the adjusted scan waveform, recalling the stored scan waveform, and using the recalled scan waveform in a second implant process.

According to another aspect of the invention, a method is provided for controlling dose uniformity in an ion implantation system. The method comprises the acts of identifying desired beam parameters; recalling a stored scan waveform, for use in a uniformity adjustment process, based on the desired beam parameters; and performing the uniformity adjustment process.

According to another aspect of the invention, apparatus is provided for controlling dose uniformity in an ion implantation system. The apparatus comprises a beam profiler for measuring a current distribution of a scanned ion beam and a data acquisition and analysis unit for adjusting an initial scan waveform based on a desired current distribution and the measured current distribution for use in a first implant process, storing the adjusted scan waveform, recalling the stored scan waveform, and using the recalled scan waveform in a second implant process.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
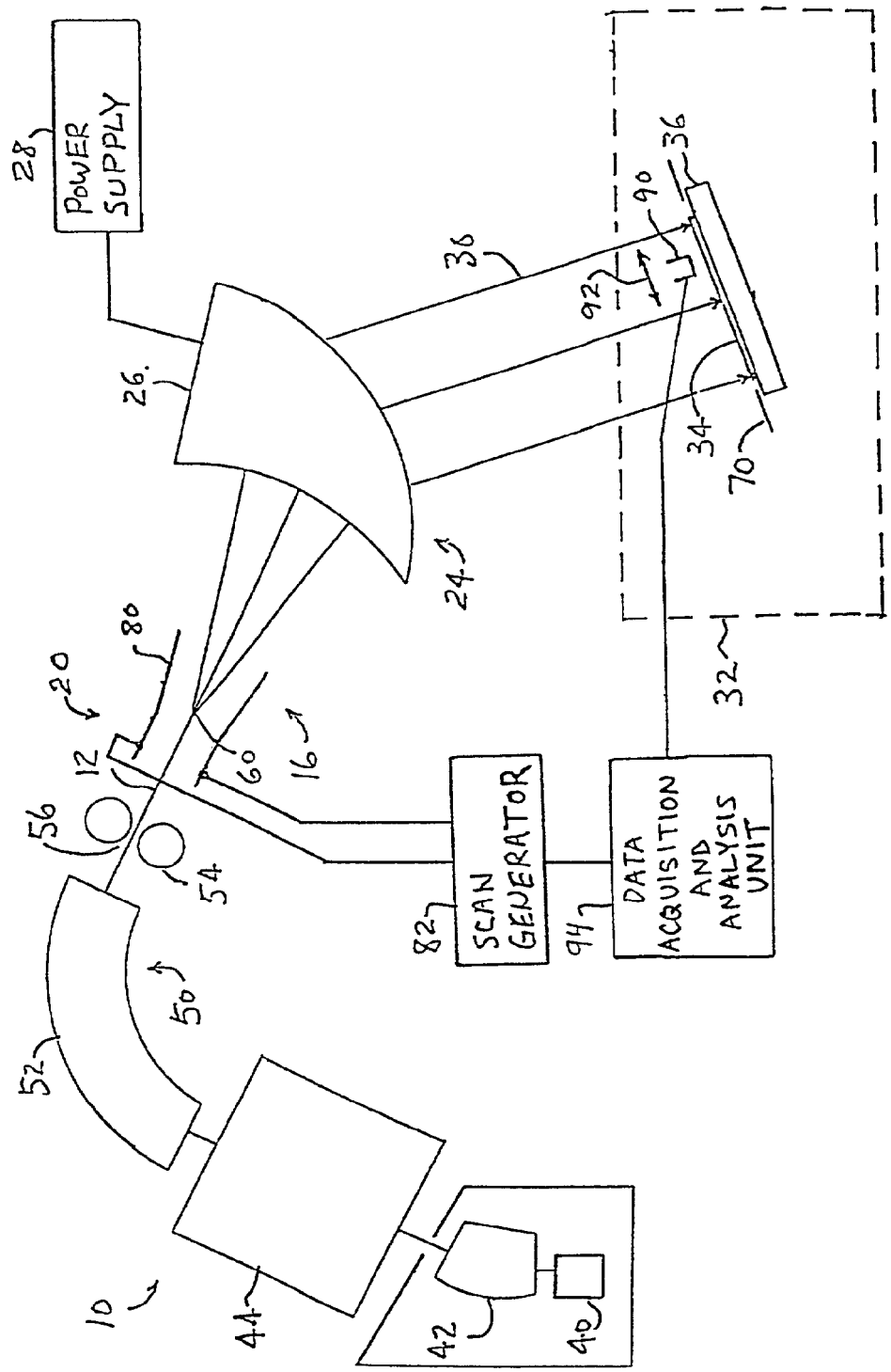
FIG. 1 is a schematic diagram of an ion implanter suitable for implementing the present invention.

A simplified block diagram of an example of an ion implanter suitable for incorporating the present invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12 having low levels of energy and mass contaminants. A scanning system 16, which includes a scanner 20 and an angle corrector 24, deflects the ion beam 12 to produce a scanned ion beam 30 having parallel or nearly parallel ion trajectories. An end station 32 includes a platen 36 that supports a semiconductor wafer 34 or other workpiece in the path of scanned ion beam 30 such that ions of the desired species are implanted into the semiconductor wafer 34. The ion implanter may include additional components known to those skilled in the art. For example, the end station 32 typically includes automated wafer handling equipment for introducing wafers into the ion implanter and for removing wafers after implantation, a dose measurement system, an electron flood gun, etc. It will be understood that the entire path traversed by the ion beam is evacuated during ion implantation.

The principal components of ion beam generator 10 include an ion beam source 40, a source filter 42, an acceleration/deceleration column 44 and a mass analyzer 50. The source filter 42 is preferably positioned in close proximity to the ion beam source 40. The acceleration/deceleration column 44 is positioned between source filter 42 and mass analyzer 50. The mass analyzer 50 includes a dipole analyzing magnet 52 and a mask 54 having a resolving aperture 56.

The scanner 20, which may be an electrostatic scanner, deflects ion beam 12 to produce a scanned ion beam having ion trajectories which diverge from a scan origin 60. The scanner 20 may include spaced apart scan plates 80 connected to a scan generator 82. The scan generator 82 applies a scan voltage waveform, such as sawtooth, or triangular, waveform, for scanning the ion beam in accordance with the electric field between the scan plates 80.

The scan waveform may be described mathematically in a number of ways. In one approach, the waveform is described by specifying the voltage as a function of time. However, in a preferred embodiment, the waveform is described by specifying the position of the beam (which corresponds exactly to a voltage) and the rate of sweep of the ion beam at that position. This formulation is convenient because the rate of sweep of the ion beam at a given position is related to the amount of current measured at that position when measuring the profile of the scanned beam. If the beam is swept more slowly at a given position, the measured current at that position increases. Conversely, if the beam is swept more rapidly at a given position, the measured current at that position decreases.

The scan waveform expressed as (position, slope) may be viewed as the derivative of the waveform expressed as (time, voltage). A scan waveform that ramps at a constant rate from −V to +V volts is a line sloping upward if plotted as voltage versus time but is a flat line at a constant height above the axis if plotted as slope versus position. In one embodiment, the scan waveform is expressed as an initial scan voltage to be applied to the plates and a series of 30 digital slope values, each of which represents the scan speed at a specified position in the scan. In one embodiment of scanner 20, scan plates 80 are powered by +/−20 kilovolt high voltage amplifiers that produce bipolar scan waveforms. The beam is deflected in either direction by the scan waveform. The deflection angle is typically plus or minus 13.5 degrees.

Angle corrector 24 is designed to deflect ions in the scanned ion beam to produce scanned beam 30 having parallel ion trajectories, thus focusing the scanned ion beam. In particular, angle corrector 24 may comprise magnetic polepieces 26 which are spaced apart to define a gap and a magnet coil (not shown) which is coupled to a power supply 28. The scanned ion beam passes through the gap between the polepieces 26 and is deflected in accordance with magnetic field in the gap. The magnetic field may be adjusted by varying the current through magnet coil. Beam scanning and beam focusing are performed in a selected plane, such as a horizontal plane.

The ion implanter further includes a Faraday beam profiler 90 positioned at or near a plane 70 of wafer 34. The beam profiler 90 is translated in the plane 70 of wafer 34, as indicated by arrows 92. The uniformity of scanned ion beam 30 is determined by translating beam profiler 90 across the plane of the wafer and monitoring beam current. The beam current distribution in the wafer plane is adjusted by altering the shape of the scan waveform. The output current from beam profiler is supplied to a data acquisition and analysis unit 94.

In one embodiment, the data acquisition and analysis unit 94 is implemented as a general purpose computer that is programmed for controlling the setup and operation of the ion implanter. In particular, the data acquisition and analysis unit 94 may be programmed for implementing the uniformity adjustment process described below. In other embodiments, the data acquisition and analysis unit 94 may be a special purpose controller or local controller that is partially or fully dedicated to scan control.

The data acquisition and analysis unit 94 may include a memory for storing one or more implant recipes that specify the parameters for doping a batch of wafers. For example, the implant recipes may identify a dopant species, an energy, and a dose to be applied to the wafers. Each of the parameters may be specified as a minimum value, a maximum value, a range of values, or a target value. An implant recipe have a name, which allows for identification of the recipe. The data acquisition and analysis unit 94 may include an operator interface to permit searching and selection of a particular implant recipe based on the identifying name of the recipe. Further, the data acquisition and analysis unit 94 may access an initial scan waveform based on the selected implant recipe.

Figure 2:
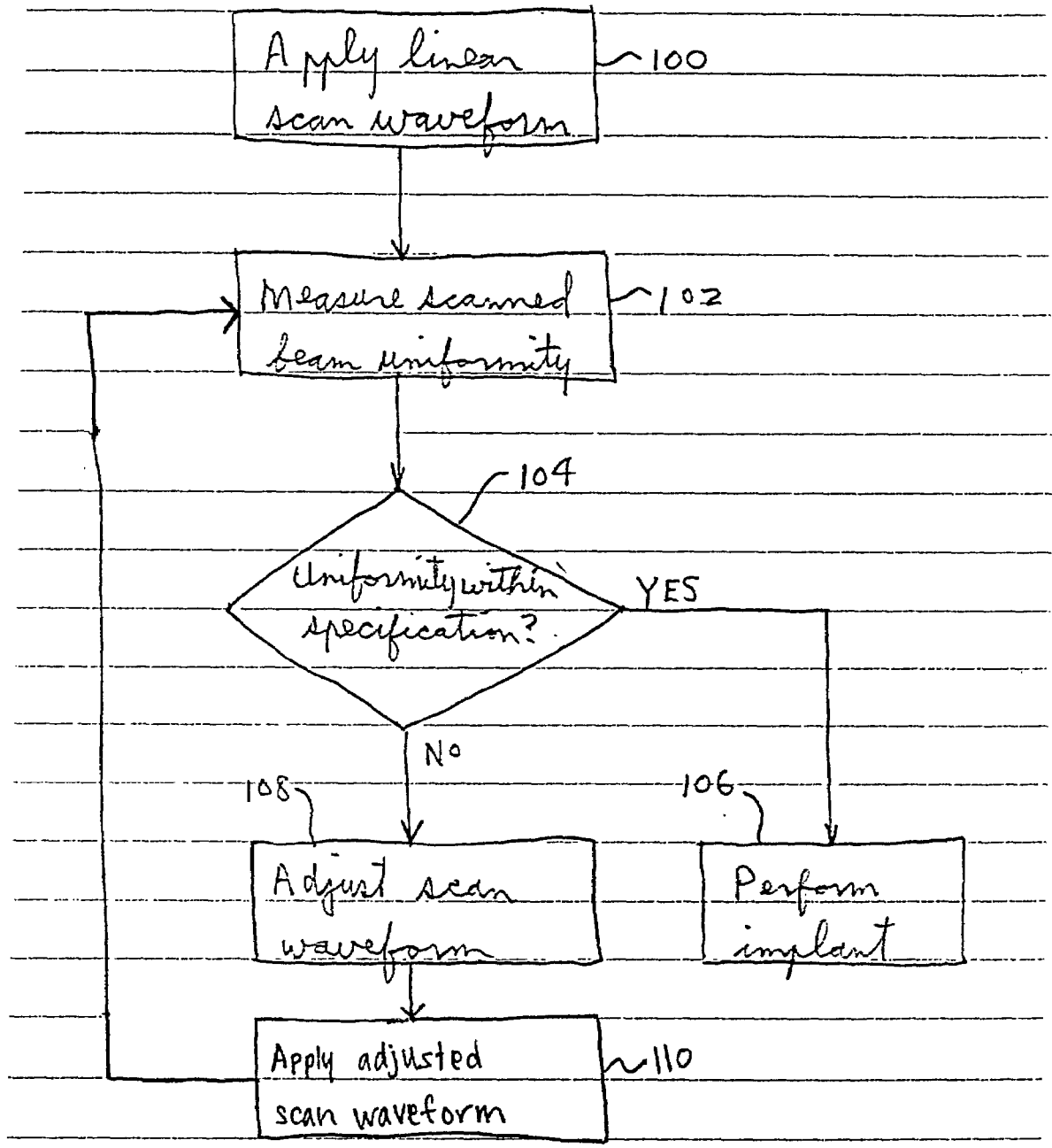
FIG. 2 is a flow chart that illustrates a prior art uniformity optimization process.

A flow chart of a process for optimizing the uniformity of a scanned ion beam according to the prior art is shown in FIG. 2. In step 100, a linear scan waveform is applied to the scan plates 80. The uniformity of the ion beam is measured in step 102. In step 104, a determination is made as to whether the uniformity is within specification. If the uniformity is determined in step 104 to be within specification, an implant is performed in step 106. If the uniformity is not within specification, the scan waveform is adjusted in step 108 to achieve the desired uniformity, and is applied to the scan plates 80 in step 110. In particular, the scan waveform is adjusted so that the ion beam is scanned faster to reduce the beam current or scanned more slowly to increase the beam current. The process then returns to step 102 to repeat the uniformity measurement. The process may require several iterations of the routine including the uniformity measurement and the scan waveform adjustment to achieve the desired uniformity.

The process illustrated in FIG. 2 and described above may be time consuming, particularly where several iterations are required to achieve the desired uniformity. In typical systems where the beam tuning process is automated, the uniformity optimization process shown in FIG. 2 has a predetermined limit on the number of iterations that may be performed. For example, the predetermined limit may be as high as ten or more iterations, or as low as one or zero iterations. When the predetermined number of iterations has been performed and the uniformity is not within specification, the process is terminated and requires operator intervention. In this case, the beam tuning process is delayed.

In prior art systems, the uniformity optimization process shown in FIG. 2 is repeated for each new set of beam parameters, i.e., each time the recipe is changed. Thus the uniformity optimization time is incurred for each new set of beam parameters. The linear scan waveform is used as the initial waveform each time the uniformity optimization process is performed.

It has been determined that the uniformity optimization process shown in FIG. 2 frequently results in similar optimized scan waveforms, particularly where the beam parameters are similar. This characteristic is utilized to provide an improved uniformity optimization process. In particular, the optimized scan waveform is saved, or stored, after a successful uniformity optimization process. The stored scan waveform is utilized in subsequent beam setups, frequently eliminating the need for uniformity optimization altogether.

Figure 3:
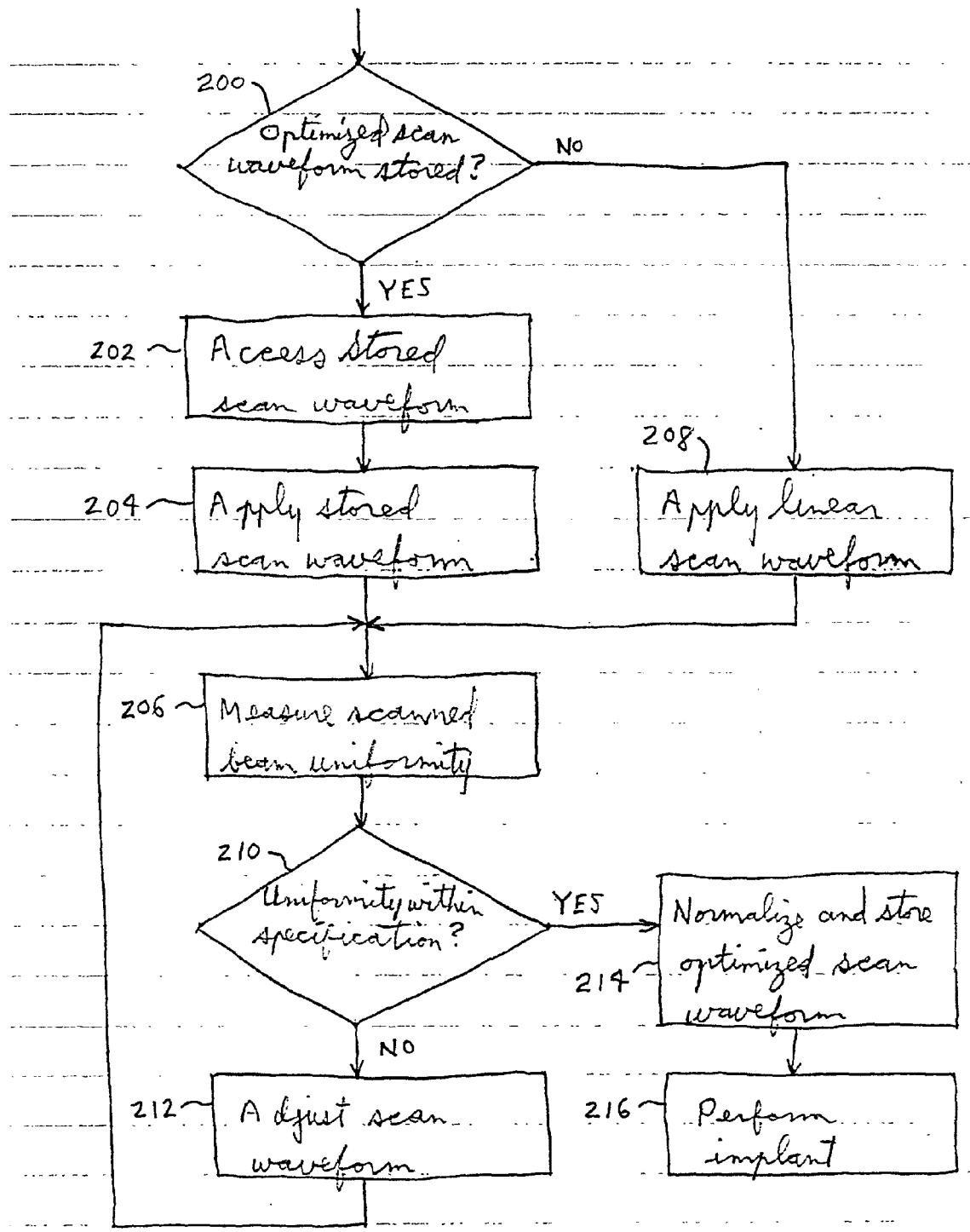
FIG. 3 is a flow chart of a uniformity optimization process in accordance with an embodiment of the invention.

A flow chart of a uniformity optimization process in accordance with an embodiment of the invention is shown in FIG. 3. It should be appreciated that the uniformity optimization process described below does not necessarily result in a scan waveform having ideal or fully optimized characteristics. Rather, optimization of the scan waveform may involve adjusting the scan waveform to achieve a desired scan waveform or a scan waveform that meets established specifications. In step 200, a determination is made as to whether an optimized scan waveform has been stored. The system may be configured to store the optimized scan waveform for each beam recipe. If an appropriate optimized scan waveform has been stored, the optimized scan waveform is accessed in step 202 and is applied to the scan plates 80 in step 204. The uniformity is then measured using beam profiler 90 in step 206. The beam profiler 90 may measure the beam current, for example, every millimeter or every few millimeters across the wafer plane 70 to determine beam uniformity. If a determination is made in step 200 that an appropriate optimized scan waveform is not stored, a linear scan waveform is applied to the scan plates 80 in step 208. The beam uniformity is then measured in step 206.

In step 210 a determination is made as to whether the uniformity is within specification. If the uniformity is not within specification, the scan waveform is adjusted in step 212. Based on the measurements of the beam current in step 206, the scan waveform is adjusted to reduce or increase the current at one or more specific points in the scan. In particular, the beam current at a point in the scan is increased by decreasing the slope of the scan waveform and thus scanning the beam more slowly at that point or is decreased by increasing the slope of the scan waveform and thus scanning the beam faster at that point. The process then returns to step 206, and the beam uniformity measurement is repeated. If a determination is made in the step 210 that the uniformity is within specification, the corresponding optimized scan waveform is stored in step 214, and the implant is performed in step 216. The stored optimized scan waveform may be associated in memory with a particular recipe to be used for performing the implant. For example, an optimized scan waveform may be associated with a particular recipe name, such that a stored optimized scan waveform may be searchable and selectable based on a particular recipe name. Further, the stored optimized scan waveform is preferably normalized, as discussed below. In one embodiment, the optimized scan waveform is stored as a series of 30 values that define the slope of the scan waveform at different points along the scan. The stored values together define the scan waveform.

It will be understood that the process of FIG. 3 utilizes a linear scan waveform as the initial scan waveform during a first uniformity optimization process. The optimized scan waveform is stored for use in subsequent uniformity optimization processes or in implant processes without uniformity optimization. If an optimized scan waveform has already been stored for a particular recipe, the prior waveform may be replaced by the more recent optimized scan waveform. By using a stored optimized scan waveform in subsequent uniformity optimization processes, fewer iterations of the uniformity measurement and waveform adjustment routine are required and the beam tuning time is reduced. Furthermore, because fewer iterations of the uniformity measurement and waveform adjustment routine are required, it is less likely that the predetermined limit on the number of iterations will be reached, and the success rate is thereby improved. It should be appreciated that in some cases, no iterations may be performed, such that the stored optimized scan waveform is used in an implant process without a subsequent uniformity optimization process. For example, an operator may specify that no iterations are to be performed if a stored optimized scan waveform for a particular recipe typically results in an ion beam uniformity that meets specification, and therefore does not require adjustment.

When a beam is tuned for the first time, it is scanned uniformly across the wafer plane 70 with equal time spent on each point. This corresponds to applying a linear scan waveform to the scan plates. The linear scan waveform consists of a collection of constant slopes. The beam profiler 90 travels in the wafer plane and measures the beam current every few millimeters, for example. Based on the shape of the beam current profile, feedback is sent to scan amplifiers in the scan generator 82 to reduce or increase the current in one or more specific locations on the wafer plane. This is achieved by scanning the beam faster or slower than the default value in these locations. The scan waveform is the collection of the sweep rates associated with each spot of the beam current profile.

In one embodiment of the invention, a normalization routine is utilized. In the normalization routine, scan slope data for the adjusted scan waveform is divided by the slope of the initial linear scan waveform, which is a constant. The normalization routine eliminates the dependency of the optimized scan waveform on beam energy. A higher beam energy requires a higher voltage to be applied to the scan plates 80 to deflect the ion beam by a given angle. Thus, the normalization routine normalizes the voltage applied to the scan plates 80, and consequently the strength of the electric field between the plates 80.

One advantage of the normalization routine is that while the unnormalized waveform contains information on how far and how fast to scan the beam across the wafer plane, the normalized waveform retains only information related to a relative scanning rate and distance. Both scanning rate and distance are linearly proportional to beam energy. Therefore, if the unnormalized waveform is saved and then used to create a new recipe for a beam with a different energy, it may not be possible to scan the beam the correct distance or at the correct rate. The normalization routine, in eliminating the dependency of the optimized scan waveform on beam energy, results in a recipe that is transparent to energy changes.

Figure 4:
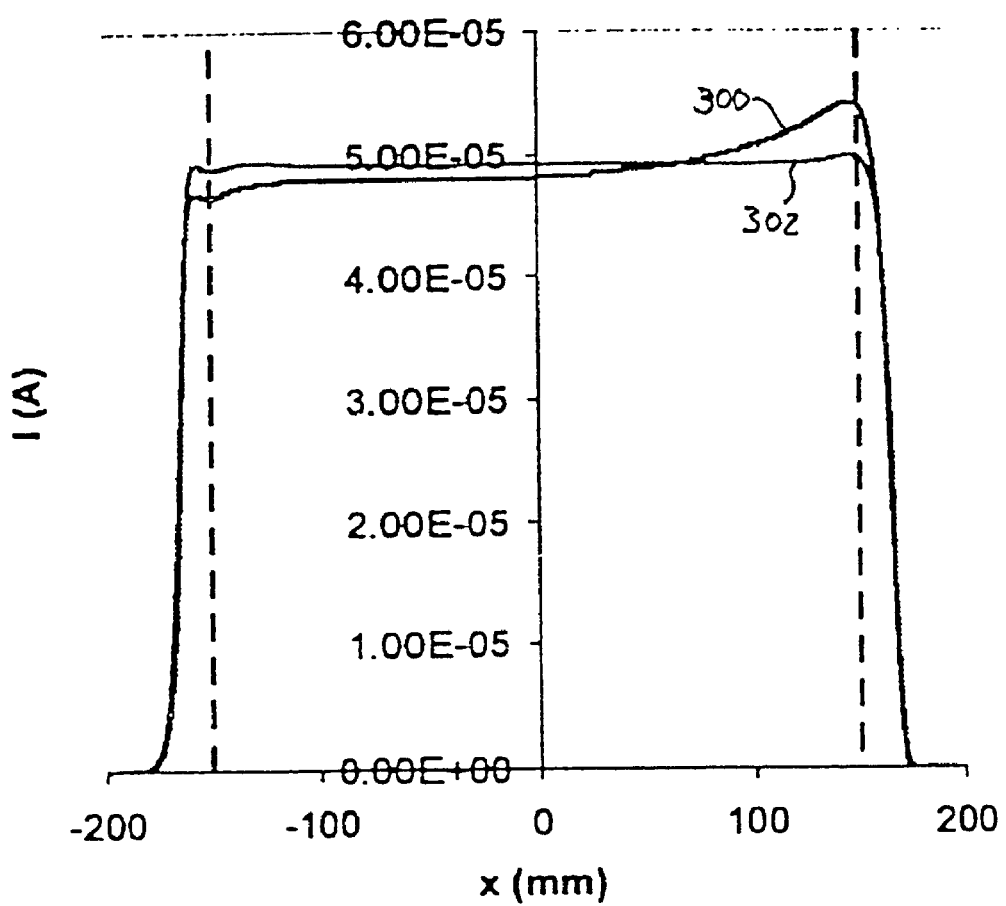
FIG. 4 is a graph of beam current as a function of position in the wafer plane and illustrates scanned beam profiles before and after scan waveform adjustment.

FIG. 4 is a graph of beam current as a function of position in the wafer plane. Scanned beam profiles before and after waveform correction are shown. The dashed lines represent the wafer edges. Curve 300 represents an uncorrected beam profile, and curve 302 represents a corrected beam profile after uniformity optimization.

While there have been shown and described what are at present considered the preferred embodiment of the present invention, it will be obvious to those skilled in the art that various changes and modifications may be made therein without departing from the scope of the invention as defined by the appended claims.

We claim:

1. A method for controlling dose uniformity by an ion beam in an ion implantation system, comprising the steps of:
    a) storing a first optimized scan waveform that has been applied to scan plates of a scanner during a first ion implantation process;
    b) recalling said first optimized scan waveform;
    c) measuring a beam current profile of the ion beam deflected by the scan plates applied with the first optimized scan waveform across a plane defined by a workpiece in an implant position, and determining whether the measured beam current profile is within a predetermined specification for a second ion implantation process;
    d) having determined that the measured beam current profile is outside the predetermined specification for the second ion implantation process, iteratively adjusting said first optimized scan waveform based on the measured beam current profile to obtain a second optimized scan waveform;
    e) normalizing a series of slope values representative of the second optimized scan waveform applied to the set of scan plates that deflect the ion beam and removing a dependency of the second optimized scan waveform on beam energy of the ion beam, and storing the second optimized scan waveform as the normalized series of slope values; and
    f) applying said second optimized scan waveform during the second ion implantation process.

2. The method of claim 1, wherein the first optimized scan waveform is linear as a function of time for a segment of the optimized scan waveform.

3. The method of claim 1, wherein the first optimized scan waveform is a triangular waveform.

4. The method of claim 1, wherein the first optimized scan waveform is non-linear as a function of time.

5. The method of claim 1, wherein the step of normalizing the series of slope values representative of the second optimized scan waveform further includes an act of dividing the series of the slope values by a constant.

6. The method of claim 1, wherein the step of storing the normalized series of slope values representative of the second optimized scan waveform at said step (e) further includes a step of storing the second optimized scan waveform for a set of ion beam parameters.

7. The method of claim 1, wherein the step of adjusting at said step (d) further includes a step of adjusting said first optimized scan waveform to obtain the beam profile within the predetermined specification of said second ion implantation, the beam profile which conforms to a first set of ion beam parameters in a first uniformity adjustment process; and wherein the step of recalling at said step (b) further includes a step of recalling the first optimized scan waveform to obtain said second desired dose uniformity of said subsequent ion implantation process for a second ion beam, the second ion beam which conforms to the first set of ion beam parameters.

8. The method of claim 1, wherein the step of storing the second optimized scan waveform includes associating the second optimized scan waveform with a set of ion beam parameters.

9. The method of claim 1, wherein the normalizing comprises dividing the series of the slope values by a linear scan waveform.

10. The method of claim 1, wherein the normalizing the series of slope values representative of the second optimized scan waveform comprises eliminating dependency of the second optimized scan waveform on beam energy of the ion beam deflected by the scan plates.

11. A method for controlling dose uniformity in an ion implantation system, comprising the steps of:
    storing a scan waveform as a normalized series of slope values, the slope values being representative of the scan waveform applied to the set of scan plates that deflect a first ion beam, the normalized series of slope values being representative of the scan waveform that is independent of beam energy of the first ion beam;
    recalling the stored scan waveform and applying the recalled scan waveform to the set of scan plates deflecting a second ion beam; and
    performing the dose uniformity adjustment process using the recalled scan waveform.

12. The method of claim 11, wherein the step of performing the uniformity adjustment process further comprises the steps of:
    identifying a desired ion beam current uniformity;
    measuring a beam current profile of the second ion beam; and
    adjusting the recalled scan waveform applied to the scan plates deflecting the second ion beam based on comparing the desired ion beam current uniformity and the measured beam current profile of the second ion beam.

13. The method of claim 11, wherein the storing the scan waveforms as the normalized series of slope values comprises dividing the series of the slope values representative of the first scan waveform by a data representing a second scan waveform to achieve the normalized series of slope values and a second sub-step of storing the normalized series of slope values.

14. The method of claim 13, wherein a data representing a second scan waveform comprises the data representative of a linear scan waveform.

15. The method of claim 14 further comprising removing a dependency of the first scan waveform on beam energy of the first ion beam.

16. A method for controlling dose uniformity by an ion beam in an ion implantation system, comprising:

determining whether the ion beam deflected by scan plates has parameters within a predetermined specification;

adjusting a scan waveform applied to scan plates to achieve an optimized scan waveform;

normalizing a series of slope values representing the optimized scan waveform applied to the scan plates that deflects the ion beam to remove a dependency of the optimized scan waveform on a beam energy of the ion beam; and storing the normalized series of slope values.

* * * * *